United States Patent
Butterworth

(10) Patent No.: US 11,227,982 B2
(45) Date of Patent: Jan. 18, 2022

(54) DEEP MOLDED REFLECTOR CUP USED AS COMPLETE LED PACKAGE

(71) Applicant: Lumileds LLC, San Jose, CA (US)

(72) Inventor: Mark Melvin Butterworth, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/104,475

(22) PCT Filed: Dec. 23, 2014

(86) PCT No.: PCT/IB2014/067266
§ 371 (c)(1),
(2) Date: Jun. 14, 2016

(87) PCT Pub. No.: WO2015/104619
PCT Pub. Date: Jul. 16, 2015

(65) Prior Publication Data
US 2016/0322549 A1 Nov. 3, 2016

Related U.S. Application Data

(60) Provisional application No. 61/924,740, filed on Jan. 8, 2014.

(51) Int. Cl.
*H01L 33/48* (2010.01)
*H01L 33/50* (2010.01)
(Continued)

(52) U.S. Cl.
CPC ............ *H01L 33/60* (2013.01); *H01L 33/486* (2013.01); *H01L 33/507* (2013.01); *H01L 33/52* (2013.01);
(Continued)

(58) Field of Classification Search
CPC . H01L 2224/48091; H01L 2924/00014; H01L 2224/16245; H01L 2224/73265;
(Continued)

(56) References Cited

U.S. PATENT DOCUMENTS

| 6,858,880 B2 | 2/2005 | Horiuchi et al. |
| 7,042,021 B2 * | 5/2006 | Isoda ............... H01L 33/486 257/100 |

(Continued)

FOREIGN PATENT DOCUMENTS

| DE | 102004045950 A1 | 3/2006 |
| EP | 0362993 A2 | 4/1990 |

(Continued)

OTHER PUBLICATIONS

EPO as ISA, International Search Report and Written Opinion dated Apr. 10, 2015 from International Application No. PCT/IB2014/067266, filed Dec. 23, 2014, 13 pages.

*Primary Examiner* — Benjamin Tzu-Hung Liu
(74) *Attorney, Agent, or Firm* — Volpe Koenig

(57) ABSTRACT

An LED package creates a narrow beam in a very compact package without use of a lens. A plastic is molded around a metal lead frame (12, 14) to form a molded cup (26), where the cup has parabolic walls extending from a bottom area of the cup to a top thereof. The lead frame forms a first set of electrodes exposed at the bottom area of the cup for electrically contacting a set of LED die electrodes (18, 20). The lead frame also forms a second set of electrodes outside of the cup for connection to a power supply. A reflective metal (28) is then deposited on the curved walls of the cup. An LED die (16) is mounted at the bottom area of the cup and electrically connected to the first set of electrodes. The cup is then partially filled with an encapsulant (64) containing a phosphor (66).

13 Claims, 2 Drawing Sheets

(51) Int. Cl.
  *H01L 33/52* (2010.01)
  *H01L 33/60* (2010.01)
  *H01L 33/62* (2010.01)
  *H01L 33/64* (2010.01)

(52) U.S. Cl.
  CPC ............ *H01L 33/62* (2013.01); *H01L 33/647* (2013.01); *H01L 33/50* (2013.01); *H01L 2224/16245* (2013.01); *H01L 2224/48091* (2013.01); *H01L 2224/73265* (2013.01); *H01L 2933/0033* (2013.01); *H01L 2933/0058* (2013.01)

(58) Field of Classification Search
  CPC ..... H01L 2933/0033; H01L 2933/0058; H01L 33/486; H01L 33/50; H01L 33/507; H01L 33/52; H01L 33/60; H01L 33/62; H01L 33/647; H01L 33/44; H01L 2924/12041; H01L 2933/0066
  See application file for complete search history.

(56) References Cited

U.S. PATENT DOCUMENTS

| | | |
|---|---|---|
| 9,287,476 B2 | 3/2016 | Ichikawa et al. |
| 9,608,181 B2* | 3/2017 | Geiger .................... H01L 33/58 |
| 2004/0159850 A1* | 8/2004 | Takenaka ............. H01L 33/486 |
| | | 257/98 |
| 2006/0125716 A1 | 6/2006 | Wong et al. |
| 2006/0226437 A1* | 10/2006 | Fujita ...................... H01L 33/60 |
| | | 257/98 |
| 2006/0261366 A1 | 11/2006 | Yang |
| 2007/0164454 A1* | 7/2007 | Andrews .............. H05K 3/4685 |
| | | 257/783 |
| 2008/0265266 A1* | 10/2008 | Bogner .................... H01L 33/60 |
| | | 257/98 |
| 2009/0026485 A1* | 1/2009 | Urano .................... H01L 33/483 |
| | | 257/99 |
| 2009/0045416 A1 | 2/2009 | Bierhuizen et al. |
| 2011/0215342 A1* | 9/2011 | Oliver ...................... B29C 43/18 |
| | | 257/81 |
| 2011/0235309 A1* | 9/2011 | Miki ....................... H05B 33/14 |
| | | 362/97.2 |
| 2011/0241055 A1* | 10/2011 | Urasaki ................... H01L 33/50 |
| | | 257/98 |
| 2012/0044682 A1* | 2/2012 | Allen ................. G02B 27/0955 |
| | | 362/241 |
| 2013/0020929 A1* | 1/2013 | van de Ven ............... H01J 1/63 |
| | | 313/498 |
| 2013/0043502 A1* | 2/2013 | Koya ...................... B29C 39/10 |
| | | 257/98 |
| 2013/0099263 A1 | 4/2013 | Heacock et al. |
| 2013/0228810 A1 | 9/2013 | Wang et al. |
| 2014/0049939 A1* | 2/2014 | Kuenzler .................. F21S 8/04 |
| | | 362/84 |
| 2014/0054623 A1* | 2/2014 | Inoue ...................... H01L 33/60 |
| | | 257/88 |
| 2014/0204585 A1* | 7/2014 | Neftin ..................... H01L 33/62 |
| | | 362/296.04 |

FOREIGN PATENT DOCUMENTS

| | | | |
|---|---|---|---|
| EP | 2034526 A1 | * | 3/2009 |
| EP | 2034526 A1 | * | 3/2009 |
| JP | 63-005580 A | | 1/1988 |
| JP | 2012-009633 A | | 1/2012 |
| JP | 2012-222304 A | | 11/2012 |
| JP | 2013-256622 A | | 12/2013 |
| WO | 2005109529 A1 | | 11/2005 |

* cited by examiner

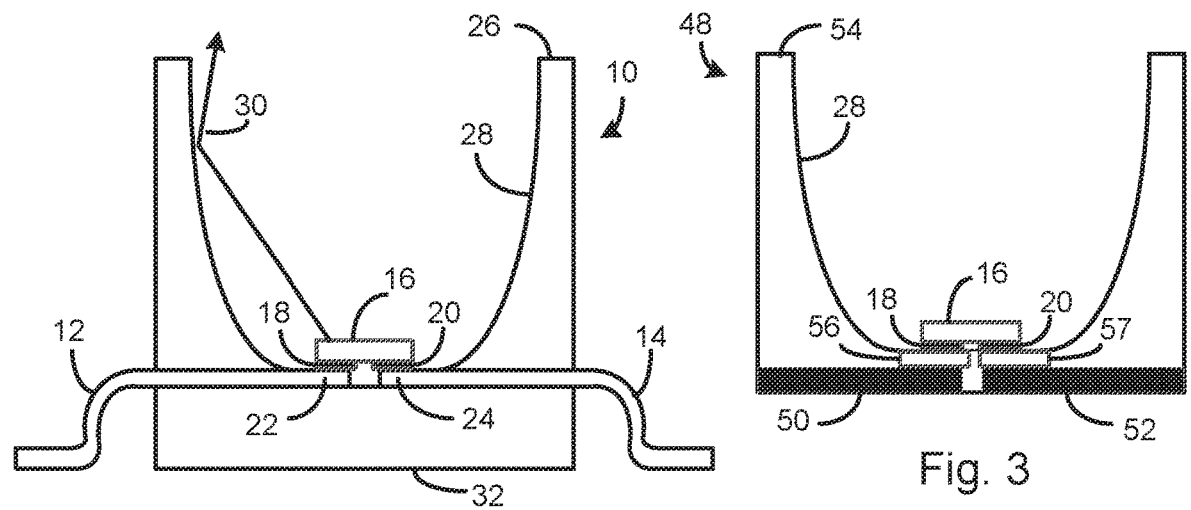
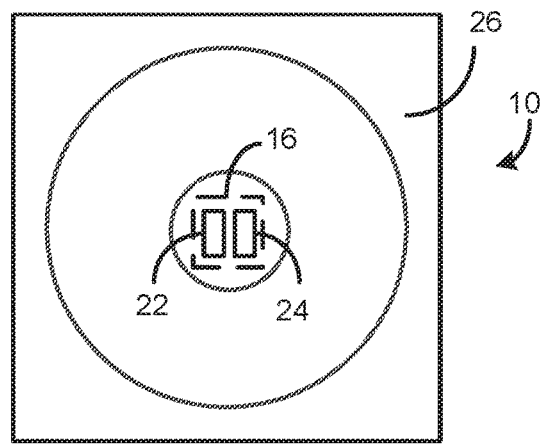

DEEP MOLDED REFLECTOR CUP USED AS COMPLETE LED PACKAGE

CROSS-REFERENCE TO RELATED APPLICATIONS

The present application is a § 371 application of International Application No. PCT/IB2014/067266 filed on Dec. 23, 2014 and entitled "DEEP MOLDED REFLECTOR CUP USED AS COMPLETE LED PACKAGE," which claims priority to U.S. Provisional Patent Application No. 61/924,740 filed Jan. 8, 2014. Both PCT/IB2014/067266 and 61/924,740 are incorporated herein.

FIELD OF THE INVENTION

This invention relates to packaged light emitting diodes (LEDs) and, in particular, to a reflective cup used as a complete and compact package for an LED die.

BACKGROUND

It is common to mount an LED die on a printed circuit board (PCB), or other substrate, for electrically connecting electrodes of the LED to conductive traces on the PCB. Then, a molded reflector cup with a center hole is affixed to the PCB and surrounds the LED die. The cup is then filled with a phosphor mixture, or a clear material, and cured to encapsulate the LED die. The cup limits the side light emission of the LED die and directs it in a generally forward direction. Therefore, the LED die package is a combination of the PCB, the cup, and the encapsulant.

In some cases, a hemispherical lens containing an encapsulant is affixed over the LED die to improve light extraction. This requires a large center hole in the cup to accommodate the lens.

The resulting package is fairly large since the PCB must extend beyond the reflective cup. Further, there are multiple parts to the package, which require handling and which reduce the reliability of the package.

Another drawback of using the molded reflector cup with the center hole is that the inner edges of the cup facing the LED die form short vertical walls, rather than angled knife edges. Knife edges are not achievable with a standard molding process. Therefore, the inner edges block some of the light rather than reflect it in a forward direction.

Additionally, conventional reflective cups are relatively shallow, which produces a wide beam, since the purpose of the cup is just to reflect the side light and contain the encapsulant. The cup is not used to shape the beam. To shape the beam, such as to collimate the beam, a lens is provided over the LED die prior to the cup being affixed to the PCB. Therefore, the lens and the added handling add further cost to the package. The lens also attenuates the light.

Some examples of shallow reflective cups are shown in US publication 2013/0228810, where the cups are completely filled and, in some cases, a lens is molded over the cup and LED die.

What is needed is a more compact, less expensive, and more reliable package for an LED die in an application that requires a collimated beam.

SUMMARY

In one example of the invention, a plastic cup is molded over a lead frame, where the center of the cup has metal pads for connection to electrodes of an LED die. The curved wall of the cup is coated with a highly reflective film, such as silver or aluminum. The cup is deep (e.g., at least 5 mm) to create a narrow collimated beam. The lead frame may extend out from the sides of the plastic cup, or the lead frame may lead to bottom electrodes on the cup. The lead frame may be copper for good electrical and heat conduction, and the metal pads/electrodes may be plated with gold, have gold bumps, wetted with solder, or otherwise prepared for being suitable for bonding to LED electrodes and to pads on a substrate (including a PCB).

The LED die is then mounted on the cup's base and electrically connected to the lead frame. The lead frame and cup material conduct heat from the LED die. Wire bonding may also be used for non-flip-chip dies.

After the LED die is mounted in the cup, the cup is partially filled with an encapsulant, which may be clear or a phosphor mixture. The encapsulant is then cured.

Since the cup does not have a center hole, it can be easily molded so that there is no vertical portion of the wall next to the LED die that blocks the light or reflects light back into the die. All light incident on the reflective wall is reflected in a forward direction.

Accordingly, the entire package is a single unit that is the size of the reflective cup. The deep cup is used to shape the beam so no lens is needed. The package has a high reliability since it is a single piece.

Other embodiments are described.

BRIEF DESCRIPTION OF THE DRAWINGS

FIG. 1 is a cross-sectional view of a flip-chip LED die mounted on a lead frame molded into a deep reflective cup in accordance with one embodiment of the invention.

FIG. 2 is a cross-sectional view of a wire-bonded LED die mounted on a lead frame molded into a deep reflective cup in accordance with another embodiment of the invention.

FIG. 3 is a cross-sectional view of a flip-chip LED die mounted on a lead frame molded into a deep reflective cup, where the lead frame forms bottom pads of the cup, in accordance with another embodiment of the invention.

FIG. 4 is a cross-sectional view of a wire-bonded LED die mounted on a lead frame molded into a deep reflective cup, where the lead frame forms bottom pads of the cup, in accordance with another embodiment of the invention.

FIG. 5 is a top down view of the cup portion of any of the embodiments of FIGS. 1-4, showing the location of bonding pads in the cup and the location of the LED die within the cup.

Elements that are the same or similar are labeled with the same numeral.

DETAILED DESCRIPTION

Figure 6:
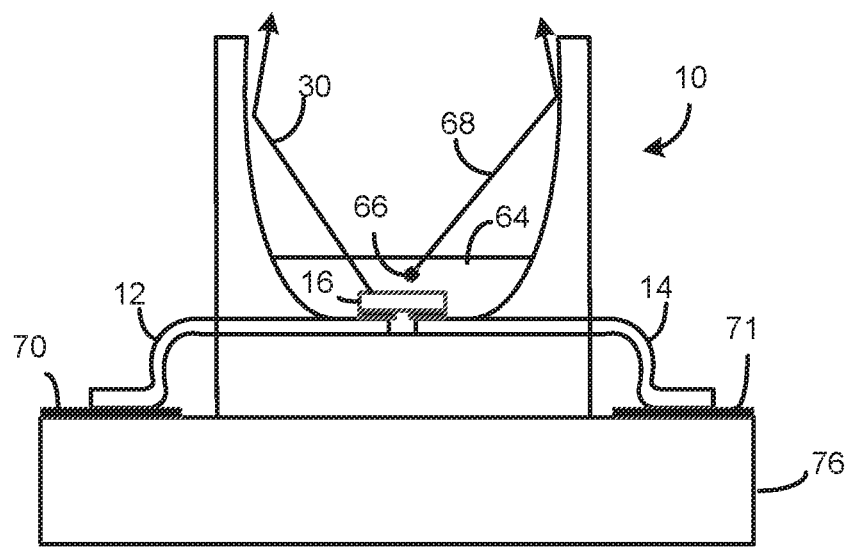
FIG. 6 illustrates the cup and LED die of FIG. 1 after a phosphor mixture or clear mixture is deposited in the cup to encapsulate the LED die.

FIG. 1 illustrates a reflective cup package 10 in accordance with one embodiment of the invention. A copper lead frame is stamped from a sheet or sheets to form the leads 12 and 14 of the package 10. There may be an array of lead frames connected together to simplify processing of the packages, and the lead frames are cut after forming the packages to separate out the individual packages.

The area where the leads 12 and 14 are to be bonded to the LED die 16 electrodes 18 and 20 may be plated with a suitable metal, such as gold or alloys, to form bonding pads 22 and 24. Gold balls, solder wetting, or other techniques, if required, may also be used to allow bonding to the die electrodes 18/20. Any portion of the lead frame that is used for an electrical connection is referred to herein as a bonding pad or an electrode, whether the connection is by solder, ultrasonic weld, wire bond, conductive epoxy, etc.

Over the lead frame is molded a plastic cup 26. An identical plastic cup is simultaneously molded over each lead frame in the array. Compression molding or injection molding may be used. Preferably, the plastic is thermally conductive. If the plastic is also electrically conductive, for example, due to containing metal particles (for increasing its thermal conductivity), the portion of the lead frame in contact with the plastic has a dielectric coating (not separately shown) formed over it prior to the molding step.

The cup 26 generally forms a parabola which is orthogonal to the plane of the top light emitting surface of LED 16, with a circular cross-section which is parallel to the plane of the top light emitting surface of LED 16, such as shown in FIG. 5. The shape can also be a compound parabolic concentrator (CPC). In one embodiment, the parabola portion of the cup 26 is about 5 mm deep, its top opening is about 6-7 mm in diameter, and its bottom surface flat area for the LED die 16 is about 1-2 mm in diameter. The cup 26 slopes up from its bottom surface to its top edge to generally reflect all LED die light upward. The deeper the cup, the narrower the beam, so the beam shape is determined by the cup shape rather than any lens. In the preferred embodiment, no lens is used.

The inside surface of the cup 26 is then coated with a reflective material 28, such as a silver or aluminum film, by sputtering, evaporation, spraying, or other process. The reflection may be specular for the narrowest beam or may be diffusive (such as by using white paint) for a wider beam. A masking process may be used to ensure that that bonding pads 22/24 are not shorted or coated by reflective material 28. In the alternative, the reflective material may be removed from bonding pad 22/24 and then plated with gold or any other suitable material.

In another embodiment, the reflective film is a dichroic coating tuned to the LED die emission. A masking process may be used to ensure that that the electrodes are not coated with reflective material 28 or the alternative dichroic coating.

The bottom electrodes 18/20 of the flip-chip LED die 16 are then bonded to the bonding pads 22/24 formed at the ends of the leads 12 and 14. The bonding may be by ultrasonic welding, solder, solder paste, conductive epoxy, or by other means. LED dies are typically square and on the order of 0.5-1 mm per side. The leads 12 and 14 form anode and cathode leads for connection to a power supply.

Depending on the application, the outer ends of the leads 12 and 14 may be soldered to metal pads on a printed circuit board (PCB) or other substrate to supply power to the LED die 16. A light ray 30 emitted from the LED die 16 is shown reflecting off the wall of the cup 26 in a forward direction. Any light rays from the side walls of the LED die 16 will similarly be reflected upwards by the cup 26.

Heat from the LED die 16 is removed by a combination of the air over the LED die 16, the leads 12 and 14, and the package 10. The bottom surface 32 of the package 10 may be thermally coupled to a substrate using a thermally conductive paste. The substrate and/or the cup 26 may have an aluminum core (not shown) that acts as a heat sink.

FIG. 5 illustrates the location of the bonding pads 22 and 24 relative to the LED die 16 (shown by dashed lines as transparent). The bonding pads 22 and 24 may be as wide or wider than the LED die 16. The leads 12/14 in FIG. 1 may be much wider than the LED die 16 to better sink the heat from the LED die.

FIG. 2 illustrates a package 36 similar to that of FIG. 1 but the LED die 38 has a top electrode that is wire bonded to a bonding pad of the lead 40 via a wire 42. The LED die 38 has a bottom electrode bonded to the bonding pad of the lead 44 for good thermal and electrically conductivity. The cup 26 is otherwise the same.

The LED die may be the type that has two top electrodes, and both electrodes are wire bonded to bonding pads of the leads. The bottom thermal pad of the LED die would be thermally bonded to the plastic base of the cup 26 using a thermally conductive epoxy.

In FIGS. 1 and 2, the width of the leads 12/14 or 40/44 may be at least as wide as the LED die, such as 2 mm wide or more, to provide a good thermal path to the substrate (e.g., a PCB).

FIG. 3 illustrates an electrode pattern for a package 48 where the lead frame forms bottom bonding pads 50 and 52 after the plastic cup 54 is molded around the lead frame. The top and bottom surfaces of the leads may be plated with gold or other metal to enhance bonding to the LED die 16 electrodes and the substrate electrodes. Gold balls, solder, or other bonding techniques may be used instead of plating. FIG. 3 shows top bonding pads 56 and 57 formed on the top surface of the lead frame. The bottom electrodes 50 and 52 may extend the entire width of the package 48 to maximize thermal contact with the substrate. The package 48 provides better thermal conduction between the LED die 16 and the substrate than the package 10 of FIG. 1.

The bonding pad configuration shown in FIG. 5 may also apply to FIG. 3.

FIG. 4 illustrates a package 58 similar to that of FIG. 3 but the top electrode of the LED die 38 is connected to the top bonding pad 60 by the wire 42.

The LED die may also have two top electrodes wire bonded to the top bonding pads of the lead frame, and the bottom thermal pad of the LED die is thermally coupled to the package 48 or 58 by a thermally conductive epoxy.

Figure 7:
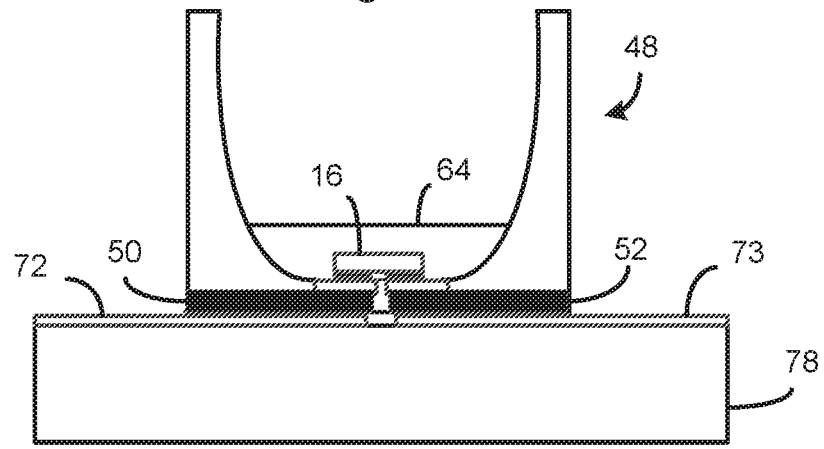
FIG. 7 illustrates the cup and LED die of FIG. 3 after a phosphor mixture or clear mixture is deposited in the cup to encapsulate the LED die.

FIGS. 6 and 7 illustrate the LED die 16 in the packages 10 and 48 being encapsulated after being mounted in the cup. The same encapsulation may also be used in the packages 36 and 58. The encapsulation protects the LED die 16 and improves light extraction by typically having an index of refraction between the LED die material (e.g., GaN) and air. For wavelength conversion, the encapsulant 64 may be a silicone binder infused with phosphor powder, such as YAG phosphor or red and green phosphor. If the LED die 16 emits blue light, some of the blue light will leak through and combine with the phosphor light to produce white light. Any color may be generated by the selection of the phosphor. A phosphor particle 66 is shown emitting a yellow light ray 68 that mixes with the LED die's blue light ray 30 to create white light.

The encapsulant 64 may instead be clear or diffusing. Silicone may be used. A diffusing material may be $TiO_2$ (white) particles in the silicone.

The phosphor may even be a separate layer covering the LED die 16 prior to depositing the encapsulant 64.

In contrast to FIGS. 6 and 7, prior art shallow cups, which are used to restrict side light are typically completely filled with an encapsulant due to the very small amount of the cup. A lens is then typically mounted over the shallow cup.

FIGS. 6 and 7 also show the leads 12/14 and bottom pads 50/52 bonded (e.g., soldered) to respective pads or traces 70-73 on a substrate 76/78, such as a PCB. The substrate 76/78 may have a metal core (not shown) for conducting the heat away from the LED die 16.

In another embodiment, the leads extend from a single side of the package and form male connectors (electrodes) for a socket or for other types of female connectors.

Figure 8:
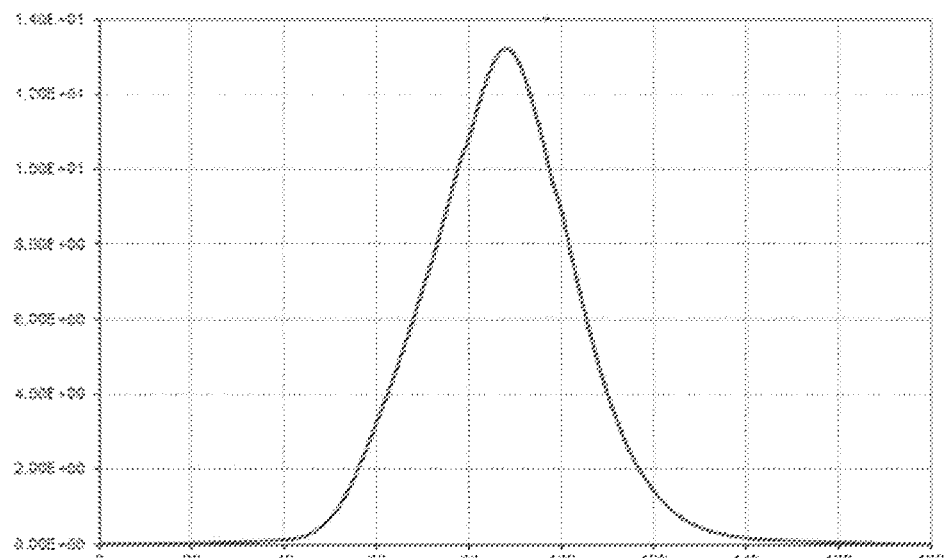
FIG. 8 is a light intensity vs. angle profile for any LED die wavelength between 400-750 nm, illustrating the relatively narrow beam that results with the deep cup of FIGS. 1-7.

FIG. 8 is a light intensity vs. angle profile of a 5 mm deep cup having parabolic reflective walls. The units on the y axis convey the relative flux rather than an absolute value. The beam is extremely well-defined, narrow, and symmetrical about the center axis of the LED die (at 90 degrees). The beam can be shaped by the cup rather than a lens. Cups having depths greater than 5 mm are also envisioned for a narrower beam. By using the deep cup package, even a low power LED may be used to generate a very bright but narrow beam.

The resulting packages are essentially a minimum possible size, given that the cup must have certain dimensions for the desired light emission.

If the plastic cup is formed of a white plastic, then no reflective film is required to be deposited on the cup walls if a diffused reflection is desired.

Although plastic has been used in the example of the moldable material, any other suitable moldable material may be used for the cup.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light emitting device comprising:
a metal lead frame including a first lead and a second lead, such that the first lead and the second lead extend beyond lateral sides of the light emitting device;
a first bonding pad on the first lead;
a second bonding pad on the second lead;
a structure comprising plastic containing metal particles molded on the first lead and the second lead, the structure including walls extending from a first area of the structure proximate to the metal lead frame, the structure being at least 5 mm deep, and the structure comprising a top opening that is at least three times as large as a bottom area, the structure comprising a dichroic coating on the walls of the structure;
a light emitting diode (LED) die disposed on the first area of the structure, the LED die including a first electrode electrically coupled to the first bonding pad and a second electrode electrically coupled to the second bonding pad; and
an encapsulant partially filling the structure, the encapsulant forming a planar surface that meets with the walls of the structure and is situated below a top edge of the structure and forming sidewalls along the walls of the structure such that the sidewalls extend contiguously from the first area of the structure to the planar surface, the encapsulant having an index of refraction between an index of refraction of the LED die and air.

2. The light emitting device of claim 1, wherein the structure is shaped as a compound parabolic concentrator.

3. The light emitting device of claim 1, further comprising a metal film coating formed over the walls of the structure.

4. The light emitting device of claim 1, further comprising a reflective material disposed on the walls of the structure.

5. The light emitting device of claim 1, wherein the LED die is less than 2 mm wide and the first bonding pad and the second bonding pad are more than 2 mm wide.

6. The light emitting device of claim 1, further comprising a layer of wavelength converting material formed over the LED die, the layer of wavelength converting material being disposed between the LED die and the encapsulant.

7. The light emitting device of claim 1, wherein the structure is electrically conductive.

8. A method of forming a light emitting device comprising:
forming a metal lead frame including a first lead and a second lead, such that the first lead and the second lead extend beyond lateral sides of the light emitting device;
forming a first bonding pad on the first lead;
forming a second bonding pad on the second lead;
molding a first material, comprising plastic containing metal particles, over the first lead and the second lead to form a molded structure, the structure including walls extending from a first area of the structure proximate to the metal lead frame, the structure being at least 5 mm deep, and the structure having a top opening that is at least three times as large as a bottom area;
disposing a dichroic coating on the walls of the structure;
mounting a light emitting diode (LED) die on the first area of the structure;
electrically connecting a first electrode of the LED die to the first bonding pad and a second electrode to the second bonding pad; and
partially filling the structure with an encapsulant, the encapsulant forming a planar surface that meets with the walls of the structure and is situated below a top edge of the structure and forming sidewalls along the walls of the structure such that the sidewalls extend contiguously from the first area of the structure to the planar surface, such that the encapsulant has an index of refraction between an index of refraction of the LED die and air.

9. The method of claim 8, further comprising depositing a reflective material on the walls of the structure.

10. The method of claim 8, wherein the structure is shaped as a compound parabolic concentrator.

11. The method of claim 8, wherein the LED die is less than 2 mm wide and the first bonding pad and the second bonding pad are more than 2 mm wide.

12. The method of claim 8, further comprising depositing a layer of wavelength converting material over the LED die before the structure is filled with encapsulant.

13. The method of claim 8, wherein the first material is electrically conductive.

* * * * *